United States Patent
Ramaswamy et al.

(10) Patent No.: US 10,134,810 B2
(45) Date of Patent: Nov. 20, 2018

(54) THREE DIMENSIONAL MEMORY ARRAY WITH SELECT DEVICE

(71) Applicant: Micron Technology, Inc., Boise, ID (US)

(72) Inventors: D.V. Nirmal Ramaswamy, Boise, ID (US); Scott E. Sills, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/604,871

(22) Filed: May 25, 2017

(65) Prior Publication Data
US 2017/0263683 A1    Sep. 14, 2017

Related U.S. Application Data

(62) Division of application No. 13/915,302, filed on Jun. 11, 2013, now Pat. No. 9,728,584.

(51) Int. Cl.
*H01L 27/24* (2006.01)
*H01L 27/11578* (2017.01)
*H01L 45/00* (2006.01)

(52) U.S. Cl.
CPC ...... *H01L 27/249* (2013.01); *H01L 27/11578* (2013.01); *H01L 27/2409* (2013.01);
(Continued)

(58) Field of Classification Search
CPC . H01L 27/249; H01L 27/2409; H01L 27/1157
See application file for complete search history.

(56) References Cited

U.S. PATENT DOCUMENTS 5,359,205 A * 10/1994 Ovshinsky ............ G11C 11/56
257/3
7,271,081 B2  9/2007 Li et al.
(Continued)

FOREIGN PATENT DOCUMENTS

CN        1947252 A    4/2007
JP    2009224466 A   10/2009
(Continued)

OTHER PUBLICATIONS

Sang-Hyun Park, et al. "Selective Wet-Chemical Etching of the Barrier Layer During Formation of Porous Anodic Aluminum Oxide Template", Journal of the Electrochemical Society, 156 (11). Published Sep. 2, 2009, Seoul National University, Seoul, South Korea. pp. K181-K185.
(Continued)

*Primary Examiner* — Matthew Reames
*Assistant Examiner* — John Bodnar
(74) *Attorney, Agent, or Firm* — Brooks, Cameron & Huebsch, PLLC

(57) ABSTRACT

Three dimensional memory arrays and methods of forming the same are provided. An example three dimensional memory array can include a stack comprising a plurality of first conductive lines separated from one another by at least an insulation material, and at least one conductive extension arranged to extend substantially perpendicular to the plurality of first conductive lines such that the at least one conductive extension intersects each of the plurality of first conductive lines. Storage element material is arranged around the at least one conductive extension, and a select device is arranged around the storage element material. The storage element material is radially adjacent an insulation material separating the plurality of first conductive lines, and the plurality of materials arranged around the storage ele- (Continued)

ment material are radially adjacent each of the plurality of first conductive lines.

20 Claims, 6 Drawing Sheets

(52) U.S. Cl.
CPC ...... *H01L 27/2418* (2013.01); *H01L 27/2427* (2013.01); *H01L 45/06* (2013.01); *H01L 45/08* (2013.01); *H01L 45/085* (2013.01); *H01L 45/1226* (2013.01); *H01L 45/143* (2013.01); *H01L 45/144* (2013.01); *H01L 45/146* (2013.01)

(56) References Cited

U.S. PATENT DOCUMENTS

| 7,659,161 | B2 | 2/2010 | Tran et al. |
|---|---|---|---|
| 8,299,571 | B2 | 10/2012 | Ozawa et al. |
| 8,378,456 | B1 | 2/2013 | Shepard |
| 8,426,976 | B2 | 4/2013 | Ishiduki et al. |
| 8,729,523 | B2 | 5/2014 | Pio |
| 8,841,649 | B2 | 9/2014 | Pio |
| 2003/0013300 | A1* | 1/2003 | Byun ............... C23C 16/0281 438/680 |
| 2007/0015348 | A1* | 1/2007 | Hsu ................. H01L 27/101 438/570 |
| 2008/0203377 | A1 | 8/2008 | Choi et al. |
| 2009/0166682 | A1 | 7/2009 | Scheuerlein |
| 2009/0227067 | A1 | 9/2009 | Kumar et al. |
| 2009/0321871 | A1 | 12/2009 | Weng et al. |
| 2009/0321878 | A1 | 12/2009 | Koo et al. |
| 2010/0044778 | A1 | 2/2010 | Seol et al. |
| 2010/0270529 | A1 | 10/2010 | Lung |
| 2011/0140068 | A1* | 6/2011 | Ozawa .............. H01L 27/249 257/4 |
| 2011/0147690 | A1* | 6/2011 | Yang ................. H01L 27/2409 257/2 |
| 2011/0233644 | A1 | 9/2011 | Fukuzumi et al. |
| 2011/0254069 | A1* | 10/2011 | Kim ................. H01L 27/11551 257/315 |
| 2011/0299328 | A1 | 12/2011 | Liu |
| 2012/0001249 | A1 | 1/2012 | Alsmeier et al. |
| 2012/0001250 | A1* | 1/2012 | Alsmeier ......... H01L 27/11551 257/319 |
| 2012/0032132 | A1 | 2/2012 | Lee et al. |
| 2012/0119179 | A1 | 5/2012 | Nakao et al. |
| 2012/0156848 | A1 | 6/2012 | Yang et al. |
| 2012/0211722 | A1* | 8/2012 | Kellam ................ G11C 5/02 257/4 |
| 2012/0217564 | A1 | 8/2012 | Tang et al. |
| 2012/0261638 | A1 | 10/2012 | Sills et al. |
| 2012/0286226 | A1 | 11/2012 | Seong et al. |
| 2012/0319076 | A1* | 12/2012 | Lee ................... G11C 11/5685 257/5 |
| 2013/0009122 | A1 | 1/2013 | Park et al. |

FOREIGN PATENT DOCUMENTS

| JP | 2010-010688 A | 1/2010 |
|---|---|---|
| JP | 2011129639 A | 6/2011 |
| JP | 2013510438 A | 3/2013 |
| KR | 10-2010-0001260 A | 1/2010 |
| KR | 10-2012-0126640 A | 11/2012 |

OTHER PUBLICATIONS

Derchang Kau, et al. "A stackable cross point phase change memory", Intel Corporation, Santa Clara, California, Dec. 2009, 4 pages.
M-J Lee, et al., "Electrical Manipulation of Nanofilaments in Transition-Metal Oxides for Resistance-Based Memory." Nano Letters, vol. 9, No. 4, pp. 1476-1481, Published online, Mar. 2009.
R. Pandian, et al., "Polarity-dependent Reversible Resistance Switching in Ge-Sb-Te Phase-change Thin Films." Appl. Phys. Letters 91, 152103, Published online Oct. 2007.
International Search Report and Written Opinion from related international application No. PCT/US2014/041042, dated Sep. 22, 2014, 19 pp.
Office Action from related Taiwanese patent application No. 103120227, dated Oct. 19, 2015, 15 pp.
Office Action from related Japanese patent application No. 2016-519550 dated Dec. 27, 2016, 11 pp.
Notice of Preliminary Rejection from related Korean patent application No. 10-2016-7000536, dated Apr. 15, 2017, 21 pp.
Darwish, et al., "Theory of Switching in MISIM Structures", IEE Proc., vol. 128, Pt. 1, No. 5, Oct. 1981, pp. 165-173.
Office Action from related Korean patent application No. 10-2016-7000536, dated Oct. 18, 2017, 7 pp.
Office Action from related Chinese patent application No. 201480037857.9, dated Jun. 2, 2017, 16 pp.
Notice of Preliminary Rejection from related Korean patent application No. 10-2017-7036848, dated Mar. 8, 2018, 7 pp.
Second Notice of Final Rejection from related Korean patent application No. 10-2016-7000536, dated Dec. 1, 2017, 7 pp.

* cited by examiner

THREE DIMENSIONAL MEMORY ARRAY WITH SELECT DEVICE

PRIORITY INFORMATION

This application is a Divisional of U.S. application Ser. No. 13/915,302 filed Jun. 11, 2013, the specification of which is incorporated herein by reference.

TECHNICAL FIELD

The present disclosure relates generally to semiconductor devices and more particularly to a three dimensional memory array with select device and methods of forming the same.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), resistance variable memory, and flash memory, among others. Types of resistance variable memory include phase change material (PCM) memory, programmable conductor memory, and resistive random access memory (RRAM), among others.

Memory devices are utilized as non-volatile memory for a wide range of electronic applications in need of high memory densities, high reliability, and data retention without power. Non-volatile memory may be used in, for example, personal computers, portable memory sticks, solid state drives (SSDs), digital cameras, cellular telephones, portable music players such as MP3 players, movie players, and other electronic devices.

Challenges related to memory device fabrication include decreasing the size of a memory device, increasing the storage density of a memory device, and/or limiting memory device cost. Some memory devices include memory cells arranged in a two dimensional array, in which memory cells are all arranged in a same plane. In contrast, various memory devices include memory cells arranged into a three dimensional (3D) array having multiple levels of memory cells. Select devices can be used to select a particular one of the memory cells of the 3D array.

DETAILED DESCRIPTION

Figure 1:
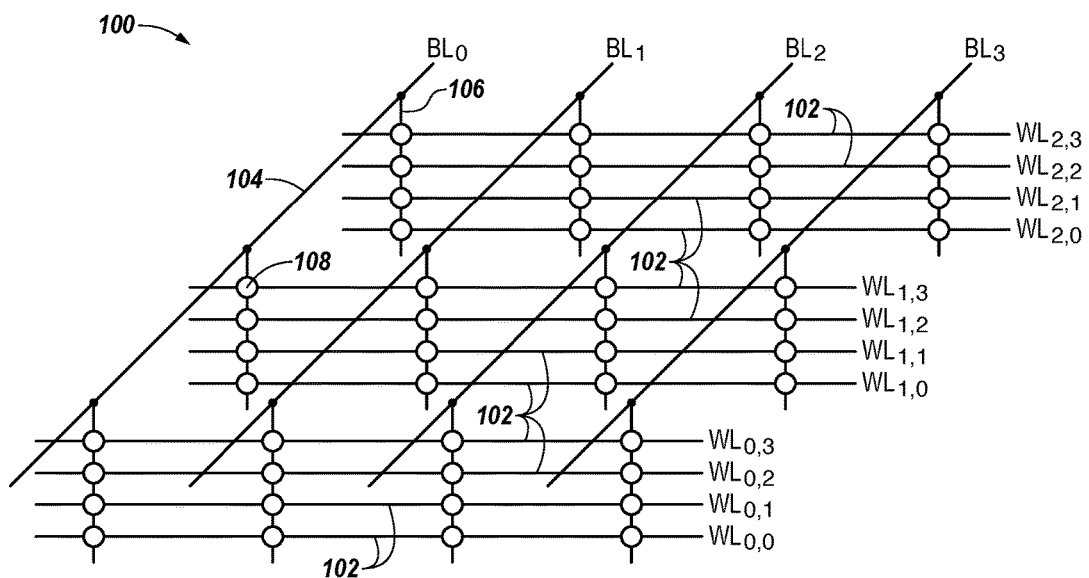
FIG. 1 illustrates a three dimensional memory array in accordance with a number of embodiments of the present disclosure.

Three dimensional (3D) memory arrays with select device and methods of forming the same are provided. An example 3D memory array can include a stack comprising a plurality of first conductive lines separated from one another by at least an insulation material, and at least one conductive extension arranged to extend substantially perpendicular to the plurality of first conductive lines such that the at least one conductive extension intersects each of the plurality of first conductive lines. Storage element material is arranged around the at least one conductive extension, and a select device is arranged around the storage element material. The storage element material is radially adjacent an insulation material separating the plurality of first conductive lines, and the plurality of materials arranged around the storage element material are radially adjacent each of the plurality of first conductive lines.

A number of embodiments of the present disclosure implement a concentric integration of a memory cell and an associated select device, e.g., access device. The disclosed three dimensional memory array can be denser than conventional two dimensional memory arrays. Furthermore, the fabrication process can be less complex and less expensive than previous approaches, e.g., by reducing a mask count associated with forming a 3D array.

Advantages of the 3D memory array having memory cells with select device formed in accordance with the present disclosure can include increased memory cell current with a circumferential memory cell area. The area of the memory cells can be tailored, at least in part, by conductive line, e.g., word line, thickness thereby minimizing die size impact. Various methods of the present disclosure for forming a 3D memory array have the benefit of not having to etch or chemical mechanical polish (CMP) near an active memory cell region.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

The FIGURES herein follow a numbering convention in which the first digit or digits correspond to the drawing figure number and the remaining digits identify an element or component in the drawing. Similar elements or components between different FIGURES may be identified by the use of similar digits. For example, 102 may reference element "02" in FIG. 1, and a similar element may be referenced as 202 in FIG. 2. Also, as used herein, "a number of" a particular element and/or feature can refer to one or more of such elements and/or features.

As used herein, the term "substantially" intends that the modified characteristic needs not be absolute, but is close enough so as to achieve the advantages of the characteristic. For example, "substantially parallel" is not limited to absolute parallelism, and can include orientations that are at least closer to a parallel orientation than a perpendicular orientation. Similarly, "substantially orthogonal" is not limited to absolute orthogonalism, and can include orientations that are at least closer to a perpendicular orientation than a parallel orientation.

FIG. 1 illustrates a three dimensional memory array 100 in accordance with embodiments of the present disclosure. Access lines, which may be referred to as word lines (WLs), are disposed on a plurality of levels, e.g., elevations, decks, planes. For example, word lines can be disposed on N levels.

Insulation material, e.g., dielectric material, can separate the levels of word lines. As such, the levels of word lines separated by insulation material form a stack of WL/insulation materials. Insulation material can also separate multiple word lines on a same level, e.g., stacks of word lines.

Data lines, which may be referred to as bit lines (BLs), can be arranged substantially perpendicular to the word lines, and can be located at a level above the N levels of word lines, e.g., at the N+1 level. Each bit line can have a number of conductive extensions, e.g., vertical extensions, in proximity to the word lines, with a memory cell 108 with select device formed between the vertical extension and the word line.

The memory array 100 includes a plurality of word lines 102 and bit lines 104. Word lines 102 are arranged into a number of levels. Word lines 102 are shown being arranged into four levels in FIG. 1. However, the quantity of levels into which the word lines 102 can be arranged are not limited to this quantity and word line 102 can be arranged into more, or fewer, levels. Word lines 102 are arranged substantially parallel one another within a particular level. The word lines 102 can be aligned vertically in a stack. That is, word lines 102 in each of the multiple levels can be located at a same relative location within each level so as to be aligned with word lines 102 directly above and/or below. Insulation material (not shown in FIG. 1) can be located between the levels at which word lines 102 are formed and between word lines 102 at a particular level.

As shown in FIG. 1, bit lines 104 can be arranged substantially parallel one another at a level different than the levels at which word lines 102 are located, e.g., above the levels at which word lines 102 are located. For instance, the bit lines 104 can be located at the top of the memory array 100. The bit lines 104 can be further arranged substantially perpendicular to word lines 102 so as to have overlappings, e.g., crossings at different levels, therebetween. However, embodiments are not limited to a strictly parallel/perpendicular configuration.

The indices shown for each word line 102 in FIG. 1 indicate the level and the position, e.g., ordering, of the word lines within a particular level. For example, word line $WL_{2,0}$ is shown being located within level 0 (a word line at the bottom of a stack of word lines) at position 2, and word line $WL_{2,3}$ is shown being located within level 3 (a word line at the top of a stack of word lines) at position 2. The quantity of levels into which the word lines 102 can be arranged, and the quantity of word lines 102 at each level can be more, or fewer, than the quantities shown in FIG. 1.

At each overlapping of a bit line 104 and a stack of word lines 102, a conductive extension 106 of the bit line 104 can be oriented substantially perpendicular to the bit line 104 and the word lines 102, so as to intersect, or pass in proximity to, each word line 102 in the stack of word lines. According to the present disclosure, a memory cell 108 includes a storage element and a select device, which are individually shown in other figures. For simplicity, FIG. 1 shows a memory cell 108 with select device located at an intersection of an extension 106 and a word line 102. That is, the conductive extension 106 of the bit line 104 can be arranged to extend vertically from the bit line 104 to intersect the respective word lines 102 below, as shown in FIG. 1. For example, the conductive extension 106 can pass through a word line 102 so as to be surrounded entirely by the word line 102.

According to various embodiments, the conductive extension 106 can pass in proximity to, e.g., near to or intersecting at least a part of, a word line 102. For example, the conductive extension 106 can pass through a portion of word line 102 so as to be partially surrounded by the word line 102, or the conductive extension 106 can pass near the word line 102 such that a memory cell 108 with select device can be formed between the conductive extension 106 and the word line 102.

Memory cells 108 with select device are shown in FIG. 1 arranged in a cross point architecture at the intersection of the conductive extension 106 of a bit line 104 and the word lines 102 located at different levels. As such, the memory cells 108 with select device can be arranged in multiple levels, each level having memory cells 108 organized in a cross point architecture. The levels of memory cells 108 can be formed at different levels from one another, thereby being vertically stacked. The three dimensional memory array 100 shown in FIG. 1 can include memory cells 108 having a common bit line 104, but separate word lines 102. Although four levels of word lines 102 (and four corresponding levels of memory cells 108) are shown in FIG. 1, embodiments of the present disclosure are not so limited and can include more, or fewer, levels of word lines 102 (and corresponding levels of memory cells 108). Memory cells 108 can be formed substantially at the same levels as word lines 102 are formed.

According to various embodiments of the present disclosure, the memory cells 108 can include a storage element connected in series with an associated select device. The storage element can comprise, for example, a resistance variable material, which are materials that can change resistance responsive to applied electrical quantities, e.g., current, voltage. Resistance variable material can include various binary transition metal oxides (TMOs), perovskite-type complex TMOs, large band gap high-k dielectrics, grapheme oxides, and non-oxides such as phase change material (PCM), e.g., chalcogenide, among others. The associated select device can be configured as, for example, a non-ohmic device (NOD) stack such as a metal-insulator-metal (MIM) switch, an ovonic threshold switch (OTS), or a metal-semiconductor-metal (MSM) switch, or other type of two-terminal select device such as a diode, etc.

In various embodiments, a memory cell 108 can be formed concentrically around the conductive extension 106 as explained in further detail with respect to FIGS. 2-4F below. Various embodiments include a three dimensional memory array of phase change material (PCM) memory cells with each memory cell comprising a PCM storage element and a select device. Such a 3D memory array can be referred to as a 3D PCMS (phase change material and switch) array.

Figure 2:
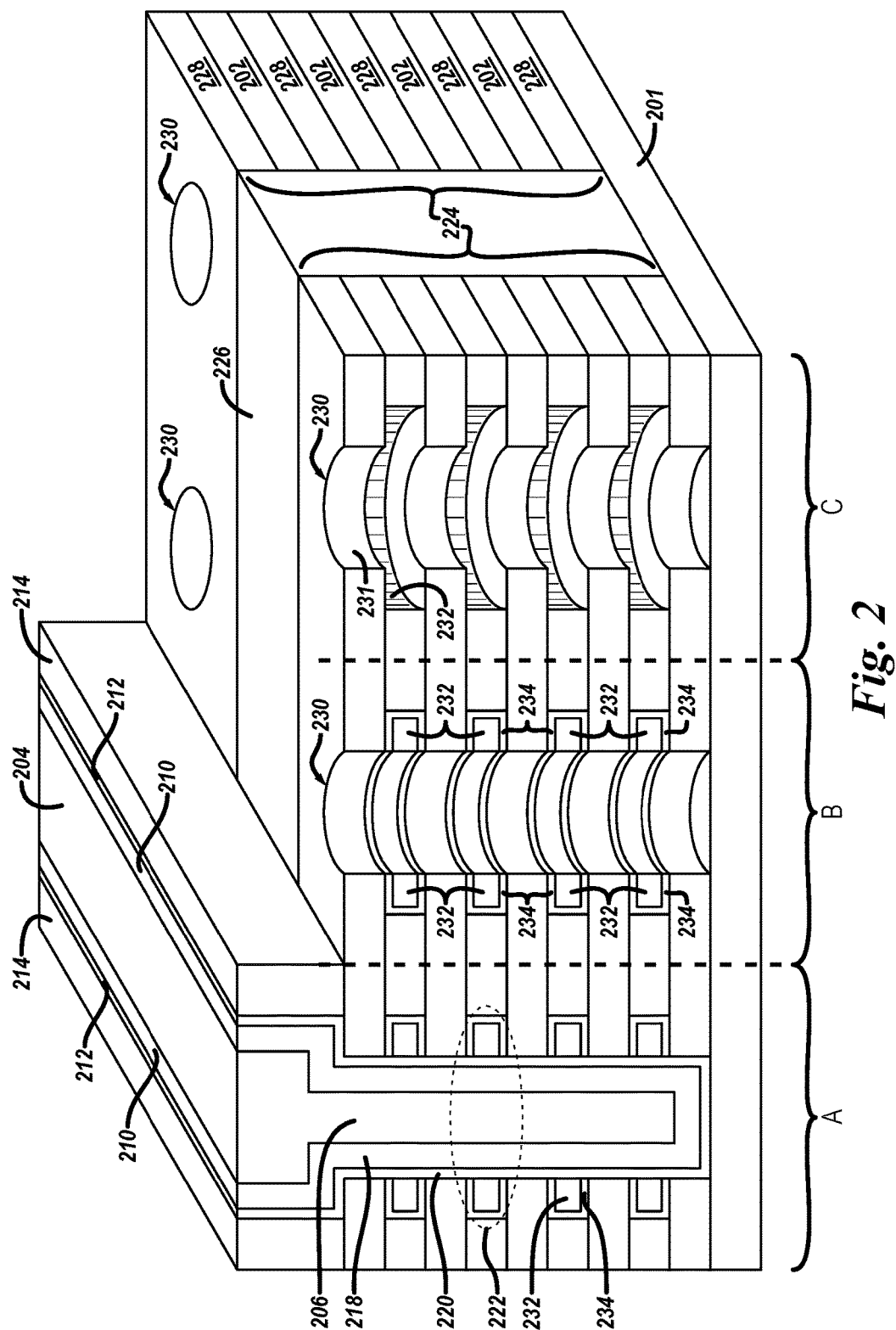
FIG. 2 illustrates a perspective view of various cutaways of a three dimensional memory array with select device in accordance with a number of embodiments of the present disclosure.

FIG. 2 illustrates a perspective view of various cutaways of a three dimensional memory array with select device in accordance with various embodiments of the present disclosure. A top view of the 3D memory array with select device is shown and described below with respect to FIG. 3. One example method for forming the various structures shown in FIG. 2 are shown and described further below with respect to FIGS. 4A-4F.

FIG. 2 illustrates concentric memory cells with select device located in proximity to a plurality of conductive lines in accordance with various embodiments of the present disclosure. Within this disclosure, "concentric" refers to structures substantially surrounding each other, and is not limited to circular shaped footprints. That is, concentric geometries can include other footprint geometries such as oval, square, rectangular, and/or other concentrically-arranged geometries. The concentric geometries are not limited to those shown in the figures, and are not limited to being pairs of same geometries. For example, an oval geometry can enclose and be concentric with a circular geometry.

FIG. 2 shows a portion of a memory array, such as memory array 100 illustrated in FIG. 1. FIG. 2 shows a stack 224 comprising a plurality of conductive lines 202, e.g., word lines, at a number of levels separated from one another by at least an insulation material 228 between conductive lines 202. A conductive extension 206 is arranged to extend perpendicular to the plurality of conductive lines 202. The conductive extension 206 is communicatively coupled at one end to a bit line 204.

The conductive lines 202 can be formed of a conductive material such as a metal, e.g., TiN. The insulation material 228 between the conductive lines 202 within a stack 224 can be a dielectric material, e.g., SiN. An insulation material 226 between stacks 224 of conductive lines 202 and insulation materials 228 can be a same or different dielectric material, e.g., SiOx.

A number of vias 230 can be formed in the stacks 224 of conductive lines 202 and insulation materials 228 such as by, for example, etching. As described further in association with FIG. 3, in the vicinity of the via 230, the conductive line 202 can be recessed such that a diameter 232 of the via through conductive lines 202 is greater than a diameter 231 of the via through the insulation materials 228. For example, a conductive line 202 formed of TiN can be recessed by a process selective to inter-level dielectric such as by Standard Clean 1 (SC1). SC1 can be performed with a 1:1:5 solution of $NH_4OH$ (ammonium hydroxide)+$H_2O_2$ (hydrogen peroxide)+$H_2O$ (water) at 75-80 degrees C. typically for 10 minutes, for example. Material(s) can be subsequently formed, e.g., deposited, through via 230 into the recesses as is shown by the cutaway perspective view shown at area C of FIG. 2.

According to various embodiments of the present disclosure, the material(s) deposited into the recesses of the conductive lines 202 can be select device materials, e.g., those that form a select device (in conjunction with the conductive material of conductive line 202) associated with a particular memory cell (storage element of the memory cell discussed further below with respect to area A of FIG. 2). As such, the material(s) deposited into the recesses of the conductive lines 202, and thus are adjacent the conductive material of a conductive line 202) can include those comprising the select device. The select device can be configured as, for example, a non-ohmic device (NOD) stack such as a metal-insulator-metal (MIM) switch, an ovonic threshold switch (OTS), or a metal-semiconductor-metal (MSM) switch, or other type of two-terminal select device. The select device is thus formed using the conductive line 202 as one conductor of the select device.

FIG. 2 shows the select device materials including an outer concentric non-metallic material 234 and an inner concentric conductor material 232. The perspective view shown at area B of FIG. 2 shows a cutaway view of the non-metallic 234 and conductor materials 232 deposited into the recesses of the conductive lines 202 around the via 230. As such, the non-metallic material 234 is sandwiched between two conductors, e.g., between a conductive line 202 and the inner concentric conductor material 232. For example, the outer concentric non-metallic material 234 can be an OTS material, e.g., a chalcogenide material, a semiconductor material, e.g., p-doped silicon (p-Si), an insulator material, e.g., dielectric, lamellar stacks comprising multiple semiconductors and/or multiple insulators (including combinations of both semiconductors and insulators), and/or any other non-metallic conductor that behaves as a non-ohmic device (NOD). The outer concentric non-metallic material 234 can be formed at an outer diameter of the recess.

The inner concentric conductor material 232 can be formed at an inner diameter of the recess, and can be formed, for example, of the same material as used to form the conductive lines 202, e.g., TiN. A spacer etch can be used to isolate the select device, e.g., the outer concentric non-metallic material 234 and inner concentric conductor material 232, between levels. Although FIG. 2 shows the select device comprising two materials adjacent the conductive lines 202, e.g., non-metallic material 234 and conductor material 232, the select device materials may include a different quantity of materials than that shown in FIGS. 2 and 3 (discussed below). If the select device is formed as an OTS, the OTS can comprise chalcogenide material, such as a chalcogenide material that is the same or different than that used for the associated storage element.

Area A of FIG. 2 is a cutaway view through the materials formed in the via 230, including the material of the conductive extension 206 and the storage element. Area A of FIG. 2 also shows a cutaway view of the structures formed above the stack 224. According to various embodiments, a select device and memory cell are arranged in series in a MSMCM configuration, as shown in region 222, where M may be any conductor, S may be any NOD material, and C is any resistive switching memory cell material (or stack of materials). As illustrated in Area A of FIG. 2, a conductive line 202 corresponds to one M, conductor material 232 corresponds to a second M, and the bit line 204 corresponds to the third M in the MSMCM configuration. The non-metallic material 234 corresponds to S, and the storage element material 212 corresponds to C in the MSMCM configuration.

FIG. 2 shows the conductive extension 206 passing through each of the conductive lines 202, and extending to a substrate 201, for example. A memory cell 108 is formed in each region 222 proximate a conductive line 202 through which a conductive extension 206 passes. The memory cell 108 of each region 222 can correspond to a memory cell, such as memory cell 108 shown in FIG. 1. The conductive extension 206 can be coupled to the bit line 204 formed at a level above the stack 224, for instance.

The bit line 204 and conductive extension 206 can each be formed of a conductive material such as a metal, e.g., Tungsten (W). The bit line 204 and conductive extension 206 can each be formed of a same conductive material. However, embodiments of the present invention are not so limited, and according to some embodiments the bit line 204 and conductive extension 206 can be coupled to one another and formed of different conductive materials.

Area A of FIG. 2 shows a storage element material 220, e.g., resistive switching material, formed in via 230 at an outermost diameter of the via 230 and adjacent to the inner concentric conductor material 232, which is formed in the recess of the conductive lines 202. The storage element material 220 comprises active region of the memory cell. Area A of FIG. 2 also shows a buffer material 218 formed in via 230 between the storage element material 220 and the conductive extension 206 such that the buffer material 218 is concentrically arranged around the conductive extension 206, and the storage element material 220 is concentrically arranged around the buffer material 218. As used herein, the term "buffer material" can include multiple materials which can implement at least one of an ion reservoir, a solid electrolyte ion conductor, and an ion diffusion barrier.

According to various embodiments, the storage element material 220 is a phase change material (PCM), the select device, e.g., inner concentric conductor material 232, is formed of an OTS material, such as a chalcogenide, for instance, and there is no buffer material 218.

According to various embodiments, the storage element material 220 is other than PCM, such as an insulating metal oxide, and the buffer material 218 is an ionic reservoir for oxygen anions or metal cations. Although FIG. 2 shows the buffer material 218 is arranged adjacent to the conductive extension 206, and the storage element material 220 can be arranged concentric to the buffer material 218, embodiments of the present disclosure are not so limited. According to various embodiments, the storage element material 220 can be arranged in proximity to the conductive extension 206, and buffer material 218 can be arranged concentric to storage element material 220.

Additional materials may be concentrically formed between the conductive extension 206 and a respective conductive line 202, such as material(s) formed between the storage element material 220/buffer material 218 and the cell select device material(s) to separate and/or provide protection between the storage element material 220/buffer material 218 and the select device material(s) to mitigate composition mixing, for instance.

Instances in which the conductive extension 206, concentric buffer material 218, and storage element material 220 passes in proximity to a respective conductive line 202, a concentric memory cell (including a storage element connected in series with a respective cell select device), can be formed between the conductive extension 206 and the conductive line 202. Concentric memory cells can be formed substantially at the same levels as the conductive line 202 are formed, such that a concentric memory cell 108 is substantially co-planar with a conductive line 202.

As shown in area A of FIG. 2, the conductive extension 206 formed in the via 230 can be coupled to a bit line 204 formed over the stack 224, concentric buffer material 218 formed in the via 230 can be coupled to buffer material 210 formed over the stack 224, and storage element material 220 formed in the via 230 can be coupled to storage element material 212 formed over the stack 224. The storage element material 212, buffer material 210, and bit line 204 can be formed over the stack 224 between isolation materials 214 formed over the stack 224 by deposition or a dual damascene deposition process, for example.

The storage element material 220 and/or storage element material 212 can be a resistance variable storage element material, and can include a PCM, for instance, among other resistance variable storage element materials. In embodiments in which the resistance variable storage element comprises a PCM, the phase change material can be a chalcogenide alloy such as an indium(In)-antimony(Sb)-tellurium(Te) (IST) material, e.g., $In_2Sb_2Te_5$, $In_1Sb_2Te_4$, $In_1Sb_4Te_7$, etc., or a germanium(Ge)-antimony(Sb)-tellurium(Te) (GST) material, e.g., $Ge_8Sb_5Te_8$, $Ge_2Sb_2Te_5$, $Ge_1Sb_2Te_4$, $Ge_1Sb_4Te_7$, $Ge_4Sb_4Te_7$, or etc., among other phase change materials. The hyphenated chemical composition notation, as used herein, indicates the elements included in a particular mixture or compound, and is intended to represent all stoichiometries involving the indicated elements. Other phase change materials can include Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, for example. Other examples of resistance variable materials include binary metal oxide materials or mixed valence oxides including two or more metals, e.g., transition metals, alkaline earth metals, and/or rare earth metals. Embodiments are not limited to a particular resistive variable material or materials associated with the storage elements of the memory cells. For instance, other examples of resistance variable materials that can be used to form storage elements include chalcogenide materials, colossal magnetoresistive materials, and/or various polymer based resistance variable materials, among others.

The memory cells comprising a select device formed in series with a phase change material, can be referred to as phase change material and switch (PCMS) memory cells. In various embodiments, the concentrically-formed storage element can function as a two-terminal phase change storage element. However, embodiments of the present disclosure are not limited to PCMS cross-point arrays or to a particular cell select switch. For instance, the methods and apparatuses of the present disclosure can be applied to other cross-point arrays such as arrays utilizing resistive random access memory (RRAM) cells, conductive bridging random access memory (CBRAM) cells, and/or spin torque transfer random access memory (STT-RAM) cells, among other types of memory cells, for example.

In various embodiments, the resistance variable storage element material can comprise one or more of the same material(s) as the select device material. For example, the series of select device and storage element may comprise a complimentary back-to-back storage device configuration. However, embodiments are not so limited. For example, the resistance variable storage element material and the select device material(s) can comprise different materials.

In various embodiments, the concentrically arranged select device can be configured as a two-terminal OTS, for instance. The OTS material(s) can include, for example, a chalcogenide material that is responsive to an applied voltage across the OTS. For an applied voltage that is less than a threshold voltage, the OTS remains in an "off" state, e.g., an electrically nonconductive state. Alternatively, responsive to an applied voltage across the OTS that is greater than the threshold voltage, the OTS enters an "on" state, e.g., an electrically conductive state. Responsive to an applied voltage near a threshold voltage, the voltage across the OTS may "snapback" to a holding voltage.

While the materials described and illustrated herein may be formed as layers, the materials are not limited thereto and may be formed in other three-dimensional configurations. Fabrication techniques are discussed further with respect to FIG. 4A-4F.

Figure 3:
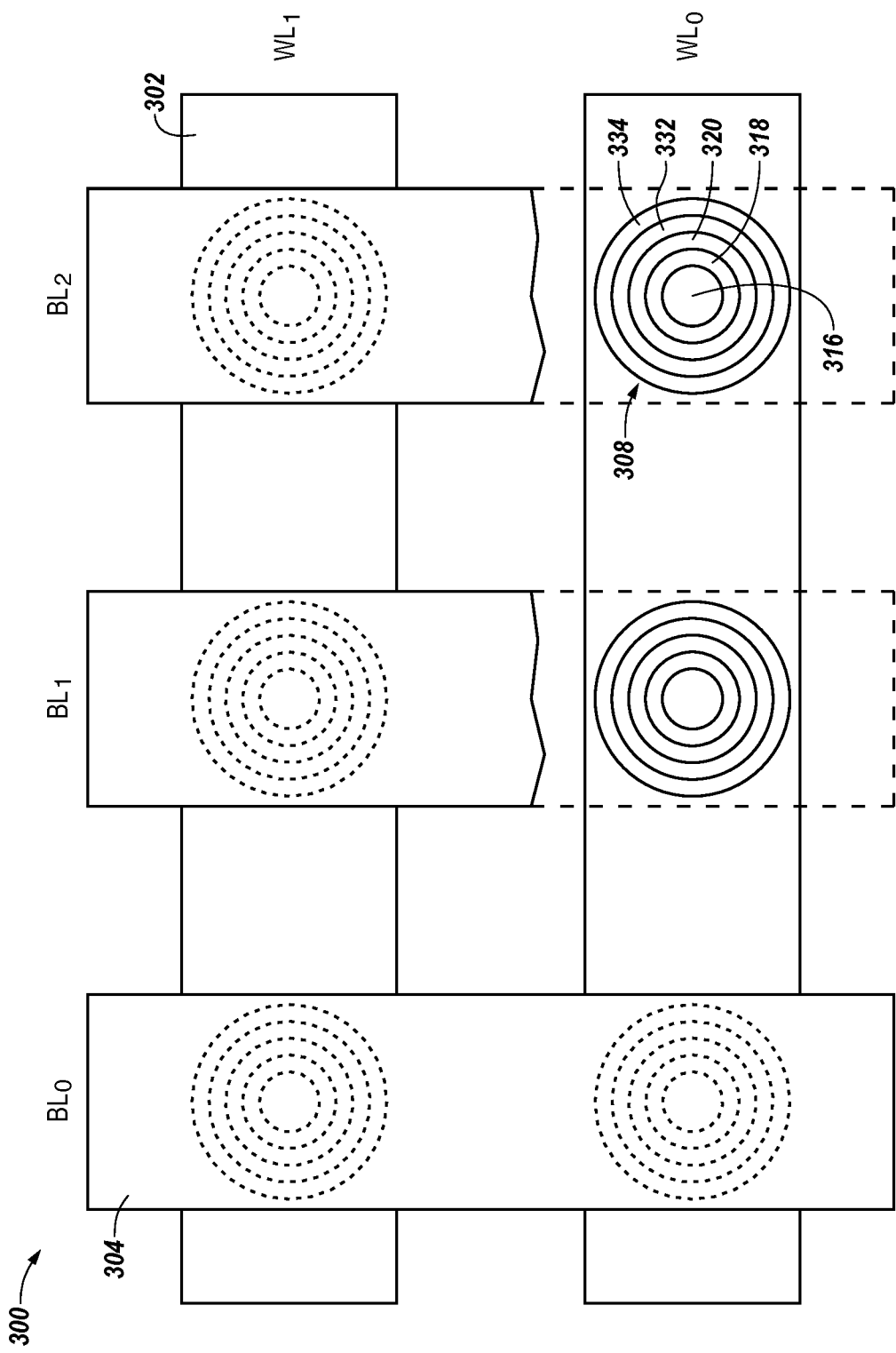
FIG. 3 illustrates location of concentric memory cells with concentric select device within a grid of conductive lines in accordance with a number of embodiments of the present disclosure.

FIG. 3 illustrates location of concentric memory cells 308 with concentric select device within a grid of conductive lines in accordance with various embodiments of the present disclosure. FIG. 3 shows a top view of a portion of a memory array 300. The memory array 300 includes a plurality of conductive lines 302, e.g., word lines, and a plurality of conductive lines 304, e.g., bit lines, arranged perpendicular to the conductive lines 302. Other levels of conductive lines 302, e.g., other levels of word lines, can be present below the word lines shown in FIG. 3. The conductive lines 302 and conductive lines 304 overlap and thereby form a grid of conductive lines.

In FIG. 3, concentric memory cells 308 having a similar structure as those shown and described with respect to FIGS.

1 and 2 are formed at location where the conductive lines 302 and 304 overlap. That is, the concentric memory cells 308 can be formed where the conductive lines 302 and 304 appear to intersect when viewed from above. However, the conductive lines 302 and 304 are formed at different levels so they do not actually intersect one another. One concentric memory cell 308 can be formed in proximity to each word line—bit line overlap, e.g., at each level of the plurality of conductive line levels.

FIG. 3 shows in cross section a conductive extension 316 passing through each conductive line 302, for example, passing through a center line of a respective conductive line 302. A buffer material 318 is concentrically arranged around the conductive extension 316. A storage element material 320, e.g., resistive switching material, is concentrically arranged around the buffer material 318. The materials forming the select device are concentrically arranged around the storage element material 320. FIG. 3 shows an inner concentric conductor material 332 concentrically arranged around the storage element material 320, and an outer concentric semiconductor material 334 concentrically arranged around the an inner concentric conductor material 332.

Although FIG. 3 shows the conductive extension 316 passing through each of the conductive lines 302 such that a cross section of the conductive extension 316 is completely surrounded by a respective conductive line 302, embodiments of the present disclosure are not so limited, and the conductive extension 316 can be arranged so as to intersect a portion of a respective conductive line 302 such that the conductive extension 316 is not completely surrounded by the conductive line 302. That is, the conductive extension 316 can be arranged so as to not intersect a centerline of a respective conductive line 302 and/or 304. Alternatively, the conductive extension 316 can be arranged so as to pass in proximity to a respective conductive line 302 rather than through any portion of the respective conductive line 302. Proximity intends close enough that the memory cell 308 can be formed between the conductive extension 316 and the conductive line 302 in an operable manner.

The structure of a concentric memory cell 308 is shown in FIG. 3 as having a circular footprint. Assuming the memory cell 308 has a radius "r," the circumference along which current flows between the memory cell 308 and the conductive line 302 is $2\pi r$. According to various embodiments, an advantage of a memory cell configuration having a circumferential select device is the increased interface area between the select device and the storage element. Therefore, for a select device that can support a fixed current density the greater interface area of the circumferential select device with the storage element can provide proportionally greater current to the storage element. The increased interface area between the circumferential select device and the storage element is proportional to the circumference and the thickness of the conductive line 302. That is, the interface area between the circumferential select device and the storage element can be changed by changing the thickness of the conductive line 302 or changing the circumference of the circumferential select device.

The effective size of a concentric memory cell, e.g., 308 shown in FIG. 3, of the present disclosure can be large compared to other memory cell configurations due to the coaxial arrangement and volumes of the storage element material 320 and/or cell select device material(s), e.g., 332 and 334. As such, a single concentric memory cell 308 with select device may not be a minimum size for a given technology node. However, the fabrication process allows for stacking several levels of memory cells within the same areal footprint, without increasing the array mask count proportionally since it is not necessary to define conductive lines 302, e.g., word lines, and conductive lines 304, e.g., bit lines, for each additional level.

Although FIG. 3 shows the buffer material 318 and storage element material 320 arranged adjacent to the conductive extension 316, and the select device materials, e.g., 332 and 334, arranged concentric to the buffer material 318 and storage element material 320, embodiments of the present disclosure are not so limited, and the various materials can be arranged, for example, in a different, e.g., reversed, order. Additionally, although FIG. 3 depicts circumferential material dimensions being approximately equal for the various materials, embodiments of the present disclosure are not so limited, and may be different in absolute measure or relative to other materials than those shown. Also, although material thicknesses are depicted equal in FIG. 2, embodiments of the present disclosure are not so limited, and may be different in absolute measure or relative to other materials than those shown.

As shown in FIG. 3, the conductive extension 316 can also be arranged to extend vertically through a location on the center line of the conductive lines 304. However, embodiments are not so limited, and the conductive extension 316 can be coupled to a respective conductive line 304 offset from a center line location while still passing through a center line of the conductive line 302, e.g., by varying slightly in horizontal positioning from that shown in FIG. 3.

FIGS. 4A-F illustrate a simplified process flow for forming a three dimensional memory array of concentric memory cells with (concentric) select device, e.g., switching device, in accordance with various embodiments of the present disclosure. The views shown in FIG. 4A-4F are similar to the cutaway perspective views shown in FIG. 2. The process flow shown in FIGS. 4A-F results in the select device material(s) associated with discrete memory cells being deposited in a recess in the word line beyond a radial distance at which a via is formed, e.g., concentric with the storage element, as previously discussed with respect to FIGS. 2 and 3.

Figure 4A:
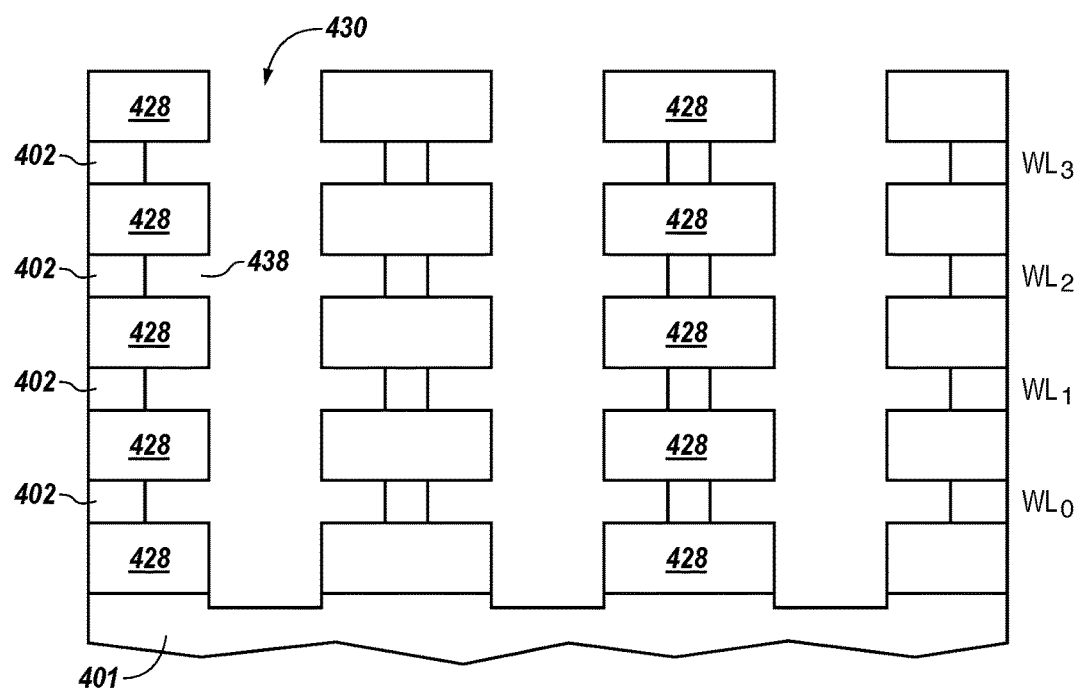
FIGS. 4A-F illustrate a simplified process flow for forming a three dimensional memory array of concentric memory cells with concentric select device in accordance with a number of embodiments of the present disclosure.

FIG. 4A shows deposit of a number of alternating insulating materials 428, e.g., dielectric, and conductive materials 402 over an etch stop material, such as substrate 401. By formation of vias 430, a portion of conductive materials 402 and insulating materials 428 can be removed. A via 430 may pass in whole, or in part, through the footprint of the conductive materials 402. Vias 430 can be etched through the alternating insulating materials 428 and conductive materials 402, for example, stopping at the substrate 401. After, or in some embodiments during, via 430 formation, the conductive materials 402 are recessed to result in the configuration illustrated in FIG. 4A, including formation of recesses 438. The recesses 438 in the conductive materials 402 can be formed, for example, with a selective etch of an exposed region of the conductive materials 402 in the via 430 by a non-directional etch such as a wet etch, e.g., SC1 clean for TiN conductive materials 402.

Figure 4B:
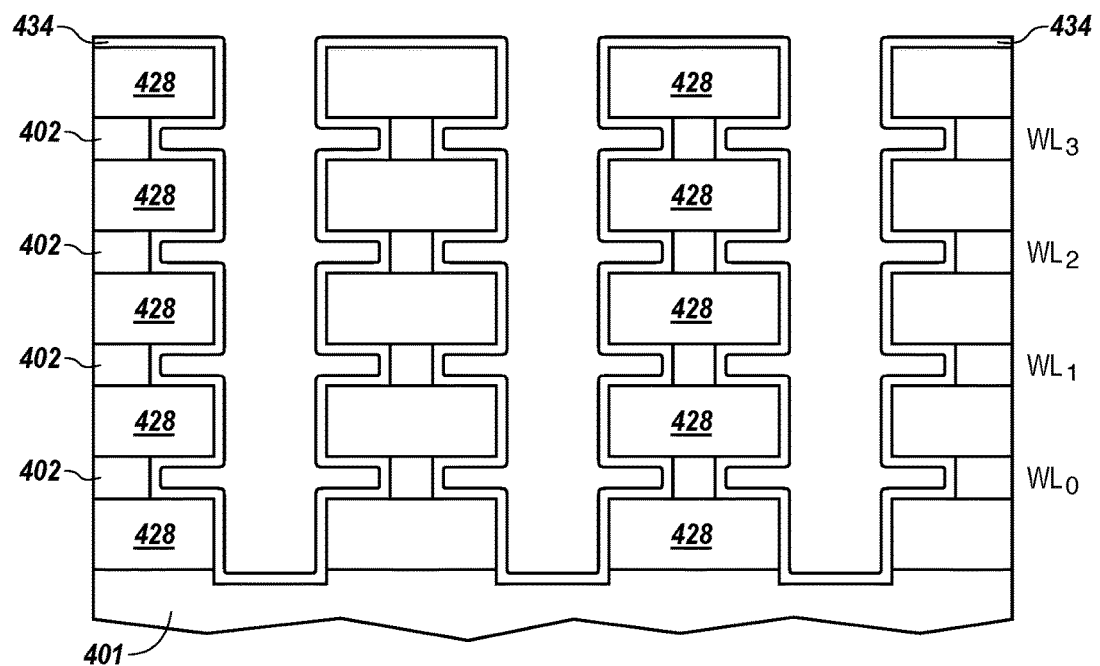

FIG. 4B shows outer select device material 434, e.g., an outer concentric semiconductor material, deposited into via 430. For example, the outer select device material 434 can be deposited, e.g., conformally, onto the sidewalls of via 430, e.g., by CVD, ALD, etc., thereby also filling the recesses 438 in the conductive materials 402 corresponding to the conductive lines, as shown.

The materials described herein may be formed by various thin film techniques including, but not limited to, spin coating, blanket coating, chemical vapor deposition (CVD) such as low pressure CVD, plasma enhanced chemical vapor deposition (PECVD), atomic layer deposition (ALD), plasma enhanced ALD, thermal decomposition, and/or thermal growth, among others. Some materials described herein, e.g., certain portions of the stack that offer direct "line-of-sight" accessibility, may be formed by physical vapor deposition (PVD), if the aspect ratio is not prohibitive.

Via aspect ratio constraints and type of deposition process used to deposit outer select device material 434 (and other materials deposited into the via 430 including the recesses 438), can be based on, e.g., determined by, select device, e.g., diode, current density. For example, PVD can be used for memory cell diameters in the range of 20 nm to 60 nm for 1 to 5 levels, e.g., number of conductive materials 402 (plus intermediate insulation materials 428), corresponding to via 430 aspect ratios in the range of 4:1 to 6:1, e.g., advantage ratio of 3E6 Angstroms/cm$^2$. ALD can be used for memory cell with select device diameters in the range of 20 nm to 60 nm for 14 to 19 levels, e.g., number of conductive materials 402 (plus intermediate insulation materials 428), corresponding to via 430 aspect ratios in the range of 9:1 to more than 11:1 (and less than 11.5:1), e.g., advantage ratio of 1E6 Angstroms/cm$^2$.

Figure 4C:
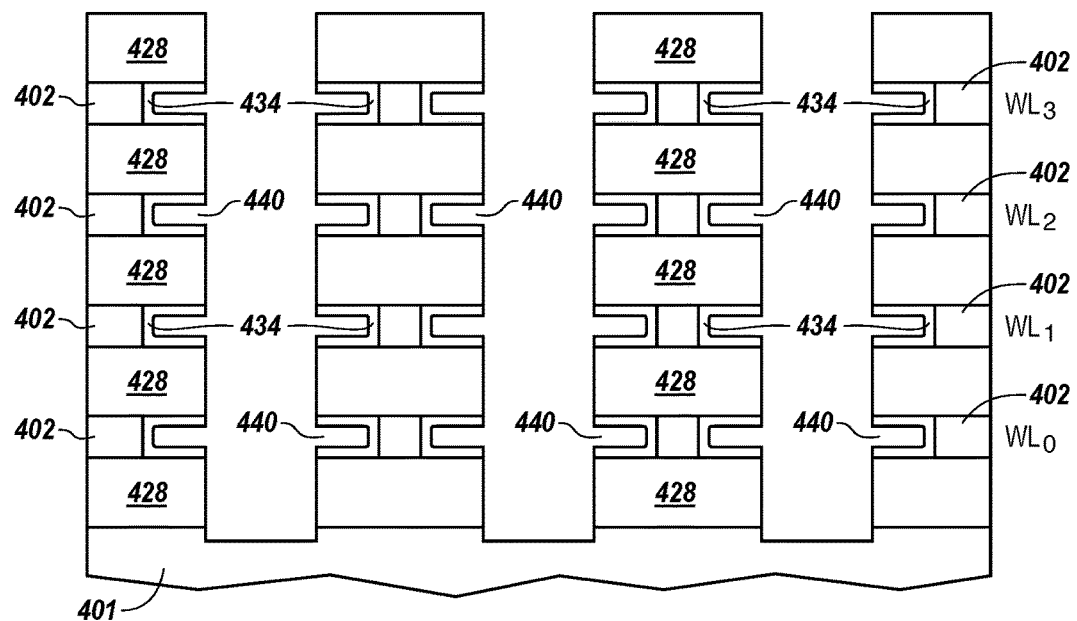

FIG. 4C shows the outer select device material 434, e.g., an outer concentric semiconductor material, after removal from within the via 430 and a portion of recess 438, thereby leaving recess 440, which has less volume that recess 438 shown in FIG. 4A. Outer select device material 434 can be removed as shown in FIG. 4C, for example, by a spacer etch (or, alternatively a wet etch back) to isolate the outer select device material 434 between levels.

Figure 4D:
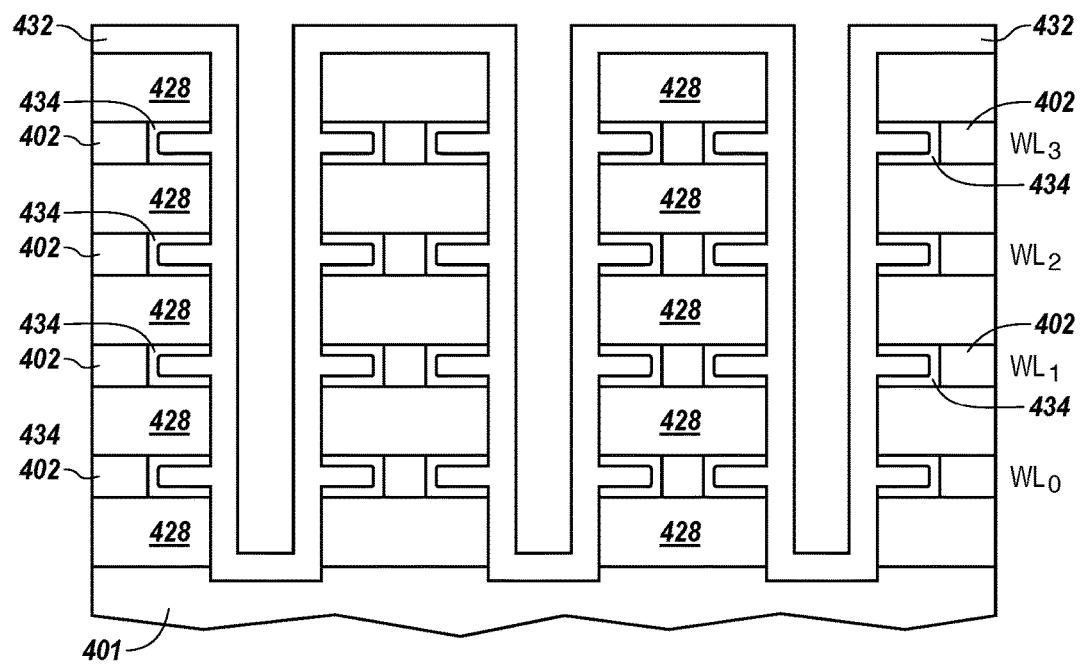

FIG. 4D shows inner select device material 432, e.g., an inner concentric conductor material, deposited into via 430, e.g., by CVD, ALD, etc. For example, the inner select device material 432 can be conformally deposited onto the sidewalls of via 430, thereby also filling the recesses 440 in the conductive materials 402 shown in FIG. 4C. The inner select device material 432 may be formed by various thin film techniques such as those described above with respect to depositing the outer select device material 434.

Figure 4E:
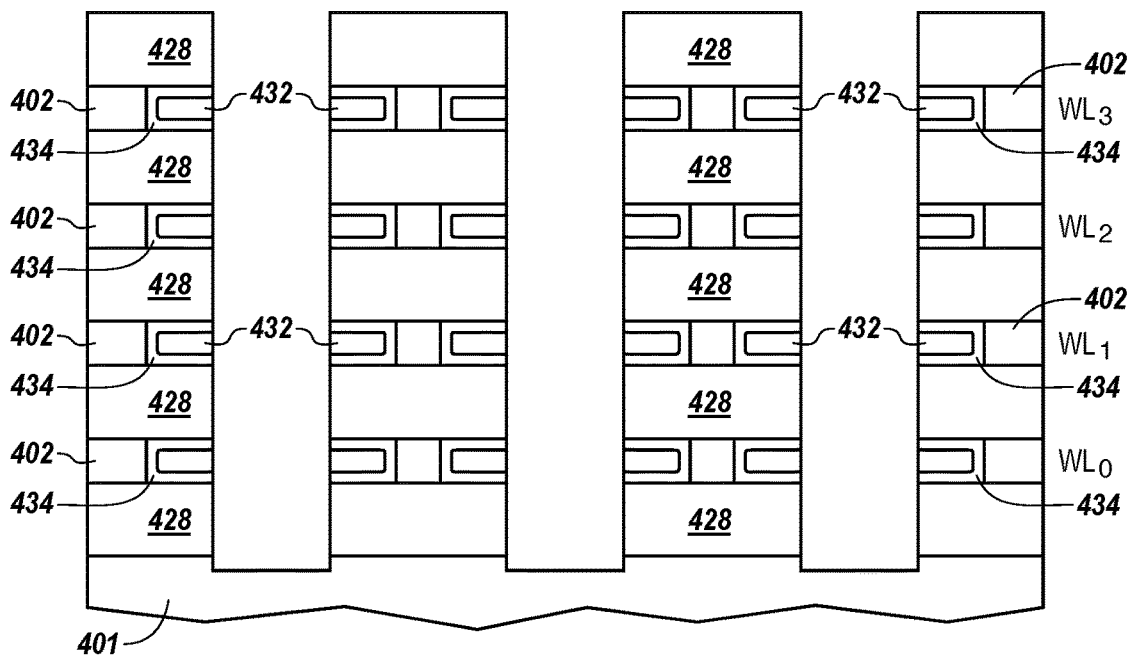

FIG. 4E shows the inner select device material 432 after removal from the top surface of the stack (224 shown in FIG. 2), i.e., above the upper insulating material 428, and from within the via 430, e.g., sidewalls and bottom, leaving however, inner select device material 432 recess 440 shown in FIG. 4C. Inner select device material 432 can be removed as shown in FIG. 4E, for example, by a spacer etch (or, alternatively a wet etch back) to isolate the inner select device material 432 between levels. Since it can be desired to have inner select device material 432 remain in recesses 440 (shown in FIG. 4C), a directional, e.g., anisotropic dry, etch can be used in removing the inner select device material 432 from via 430.

Figure 4F:
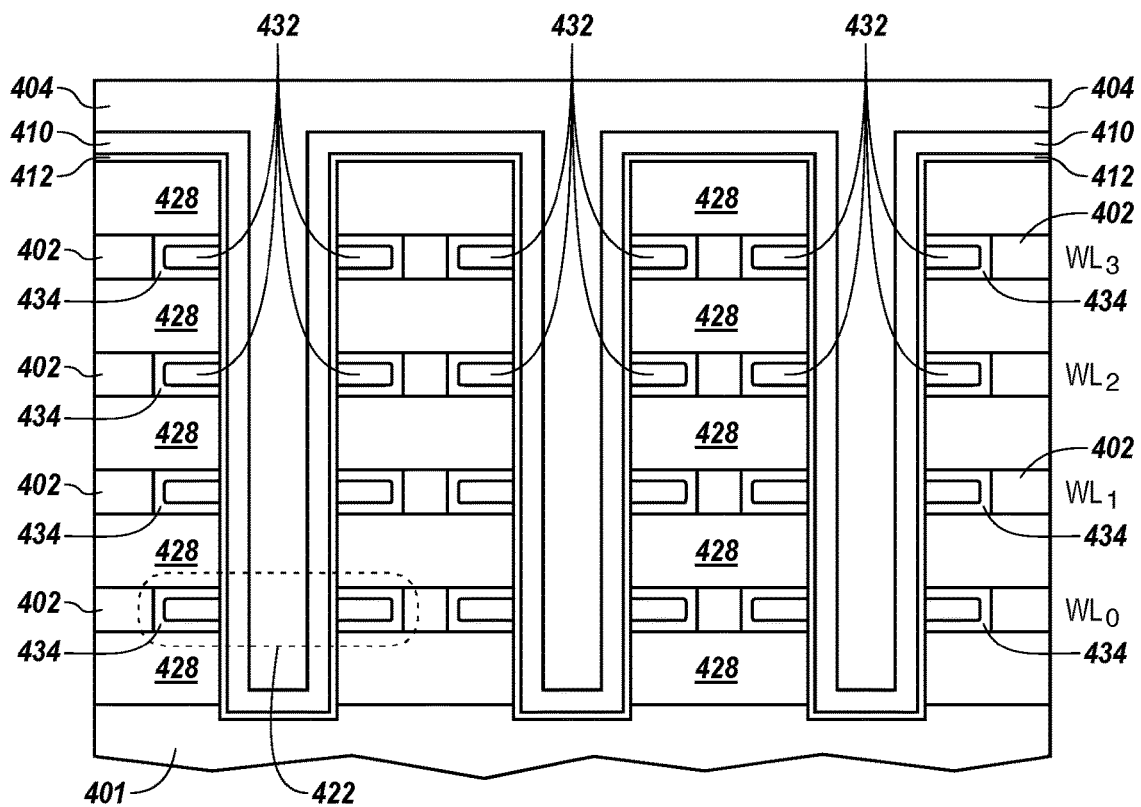

After recess 440 is filled with the inner select device material 432 and the excess removed from within via 430 as shown in FIG. 4E, further processing can include depositing various materials in via 430, as shown in FIG. 4F. Bit lines 404 can be patterned over the stack, along with other materials. For example, concentric storage element material, concentric buffer material, and conductive extension material can be formed in via 430, and storage element material 412, buffer material 410, and bit line 404 can be formed over the stack, as previously described with respect to FIG. 2. According to some embodiments, the various materials can be deposited in via 430 and deposited on top of the stack at a same time, e.g., to for the bit lines such as 204 shown in FIG. 2. According to some embodiments, the various materials can be deposited in via 430, with the stack subsequently being polished, after which materials formed over the stack are patterned. According to some embodiments, the various materials can be deposited in via 430 and dual-damascene deposition can be used to form the materials over the stack, after which the stack and bit lines can be polished.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method of forming a three dimensional memory array, comprising:
   forming a stack comprising a plurality of first conductive lines separated from one another by insulation material;
   forming a via through the stack such that at least a portion of the via passes through each of the plurality of first conductive lines;
   forming a recess in at least one of the plurality of first conductive lines adjacent the via;
   forming a select device in the recess;
   forming a storage element material within the via, wherein the select device includes an inner concentric conductor material in physical contact with the storage element material and an outer concentric non-metallic material in physical contact with at least two surfaces of the inner concentric conductor material; and
   forming a conductive extension within the via.

2. The method of claim 1, further comprising forming a buffer material in the via adjacent the storage element material and the conductive extension.

3. The method of claim 1, wherein forming a select device in the recess includes:
   Forming the non-metallic material in the recess; and
   forming the conductor material in the recess.

4. The method of claim 3, wherein forming the conductor material in the recess includes forming the conductor material of a same material as the plurality of first conductive lines.

5. The method of claim 3, wherein forming a select device in the recess includes:

first forming the non-metallic material in the recess; and subsequently forming the conductor material in the recess.

6. The method of claim 3, wherein forming the non-metallic material in the recess includes:
depositing a semiconductor material in the recess; and
removing only a portion of the semiconductor material in the recess to form a second recess.

7. The method of claim 6, wherein depositing the semiconductor material in the recess includes conformally depositing the semiconductor material in the via and recess by a chemical vapor deposition (CVD) method when the plurality of first conductive lines includes less than six (6) first conductive lines and the via has an aspect ratio of less than six-to-one (6:1).

8. The method of claim 6, wherein depositing the semiconductor material in the recess includes conformally depositing the semiconductor material in the via and recess by an atomic layer deposition (ALD) method when the plurality of first conductive lines includes between fourteen (14) and nineteen (19) inclusive, and the via has an aspect ratio of between nine-to-one (9:1) and eleven-to-one (11:1).

9. The method of claim 6, wherein forming the conductor material in the recess includes forming the conductor material in the second recess.

10. The method of claim 3, wherein forming the recess includes forming the recess at an exposed region of each of the first conductive lines in a wall of the via by a non-directional etch that is more selective to the first conductive lines than the insulation material; and
wherein forming the conductor material in the recess includes:
depositing the conductor material within the recess, and
removing the conductor material not within the recess.

11. The method of claim 1, further comprising forming a plurality of second conductive lines arranged to extend substantially perpendicular to the plurality of first conductive lines at a different level than a number of levels at which the plurality of first conductive lines are arranged, and arranged to extend substantially perpendicular to the conductive extension,
wherein the conductive extension is coupled to at least one of the plurality of second conductive lines.

12. The method of claim 11, wherein forming the plurality of second conductive lines includes forming the plurality of second conductive lines by a dual-damascene process.

13. A method of forming a memory array, comprising:
forming a stack comprising a number of first conductive lines separated from one another by insulation material;
forming a via through the stack such that at least a portion of the via passes through each of the number of first conductive lines;
forming a recess in at least one of the number of first conductive lines adjacent the via;
forming a select device in the recess in the number of first conductive lines adjacent the via;
forming storage element material within the via adjacent the select device, wherein the select device includes an inner concentric conductor material in physical contact with the storage element material and an outer concentric non-metallic material in physical contact with at least two surfaces of the inner concentric conductor material; and
forming a conductive extension concentrically within the storage element material.

14. The method of claim 13, wherein forming the select device in the recess includes forming one of a metal-semiconductor-metal device and a metal-insulator-metal device with one of the number of first conductive lines.

15. The method of claim 14, wherein forming the via includes forming the via to have a particular aspect ratio, and forming the select device includes depositing material comprising the select device in the recess,
wherein the particular aspect ratio of the via and the process by which the material comprising the select device is deposited in the recess is based on a current density of the select device.

16. A method of forming a memory array, comprising:
forming a stack comprising a plurality of conductive lines separated from one another by insulation material;
forming at least one conductive extension such that the at least one conductive extension is arranged to extend substantially perpendicular to the plurality of conductive lines, wherein the at least one conductive extension intersects at least one conductive line among the plurality of conductive lines;
forming a storage element material around the at least one conductive extension;
forming a buffer material such that buffer material is disposed concentrically between and in physical contact with the at least one conductive extension and the storage element; and
forming a select device such that the select device is arranged around the storage element material, wherein the select device includes an inner concentric conductor material in physical contact with the storage element and an outer concentric non-metallic material in physical contact with at least two surfaces of the inner concentric conductor material.

17. The method of claim 16, further comprising forming the select device such that select device includes an inner concentric conductor material in physical contact with the storage element material at two discrete locations, and an outer concentric non-metallic material arranged around the inner concentric conductor material such that the outer concentric non-metallic material is in physical contact with a first surface, a second surface, and a third surface of the inner concentric conductor material.

18. The method of claim 16, further comprising forming the select device such that the select device includes a non-metallic material at an outside diameter of a ring geometry and a conductor material at an inside diameter of the ring geometry and in physical contact with the storage element material at two discrete locations.

19. The method of claim 16, further comprising forming a second buffer material around the storage element material, the second buffer material being located between the select device and the storage element material.

20. The method of claim 16, further comprising forming a plurality of second conductive lines arranged to extend substantially perpendicular to the plurality of first conductive lines at different planes than planes at which the plurality of first conductive lines are arranged, and arranged to extend substantially perpendicular to the at least one conductive extension,
wherein the at least one conductive extension is in contact with at least one of the plurality of second conductive lines.

* * * * *